United States Patent
Tazaki et al.

(12) 
(10) Patent No.: US 6,188,734 B1
(45) Date of Patent: *Feb. 13, 2001

(54) DATA REPRODUCING METHOD AND APPARATUS

(75) Inventors: Saburo Tazaki, Matsuyama; Makoto Hiramatsu, Kawasaki, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/742,783

(22) Filed: Oct. 31, 1996

(30) Foreign Application Priority Data

Nov. 1, 1995 (JP) .................................. 7-284922

(51) Int. Cl.$^7$ ............................ H04L 25/08; G11B 20/10
(52) U.S. Cl. .......................... 375/341; 714/794; 369/59
(58) Field of Search ................................... 375/262, 263, 375/265, 290, 340, 341, 346, 348; 360/46, 51, 65; 369/47, 59, 124; 714/792, 794, 795

(56) References Cited

U.S. PATENT DOCUMENTS

| | | | |
|---|---|---|---|
| 4,954,903 | * 9/1990 | Fuji et al. | 360/46 |
| 5,095,392 | 3/1992 | Shimazaki et al. | 360/40 |
| 5,377,207 | 12/1994 | Perlman | 371/37.11 |
| 5,392,316 | * 2/1995 | Sawaguchi et al. | 375/290 |
| 5,404,249 | 4/1995 | Seki | 360/48 |
| 5,469,420 | * 11/1995 | Fujita et al. | 369/59 |
| 5,548,284 | 8/1996 | Hiramalsu | 341/68 |
| 5,604,724 | * 2/1997 | Shiokawa | 369/124 |
| 5,748,593 | * 5/1998 | Tanaka et al. | 369/59 |
| 5,822,371 | * 10/1998 | Goldstein et al. | 375/242 |

FOREIGN PATENT DOCUMENTS

94181363 8/1996 (JP) .

OTHER PUBLICATIONS

Integration, The VLSI Journal, vol. 12, No. 1, Nov. 1, 1991, pp. 79–91, XP000272942, Paaske E et al: "An Area–Efficient Path Memory Structure for VLSI Implementation of High Speed Viterbi Decoders", p. 82, line 24, p. 83, line 9; figure 4.

Proceedings of the International Symposium on Circuits and Systems, San Diego, May 10–13, 1992, vol. 4, 1992, May 10, 1992, Institute of Electrical Engineers, pp. 1871–1874, XP000338359, Fettweis G et al: A Combined Reed–Solomon Encoder and Syndrome Generated with Small Hardware Complexity.

S. Tazaki, "A Reliable Signal Detection Method for the combination of PRML method and Ternary Recording Code", Proc. '94 IEEE ISIT, p. 214, Jun. 1994.

* cited by examiner

*Primary Examiner*—Young T. Tse
(74) *Attorney, Agent, or Firm*—Fitzpatrick, Cella, Harper & Scinto

(57) ABSTRACT

A data reproducing apparatus for reproducing data subjected to convolution by partial response, by using maximum likelihood, includes a memory including a plurality of memory arrays which respectively correspond to plural states that the data can take and each of which has a predetermined number of regions each corresponding to a time point. A detecting device periodically detects, from the data, states before the plural states have been shifted, and a control device causes values respectively representing the detected states before shifting to be sequentially stored in the regions of the memory arrays every time detection is performed by the detection device, causing the values previously stored in the memory arrays to be replaced in accordance with the detected states before shifting, and when all values stored in the regions of the memory arrays corresponding to the same time point match, reproducing the data on the basis of the matching value.

13 Claims, 9 Drawing Sheets

*FIG. 7A* TIME POINT $T_1$

MEMORY
(2bit × 4 × 16)

| | | | | | | | |
|---|---|---|---|---|---|---|---|
| $S_0$ | 2 | | | | | | |
| $S_1$ | 0 | | | | | | |
| $S_2$ | 3 | | | | | | |
| $S_3$ | 1 | | | | | | |

*FIG. 7B* TIME POINT $T_2$

MEMORY
(2bit × 4 × 16)

| | | | | | | | |
|---|---|---|---|---|---|---|---|
| $S_0$ | 2 | 0 | | | | | |
| $S_1$ | 3 | 2 | | | | | |
| $S_2$ | 1 | 3 | | | | | |
| $S_3$ | 0 | 1 | | | | | |

*FIG. 7C* TIME POINT $T_3$

MEMORY
(2bit × 4 × 16)

| | | | | | | | |
|---|---|---|---|---|---|---|---|
| $S_0$ | 1 | 3 | 2 | | | | |
| $S_1$ | 1 | 3 | 2 | | | | |
| $S_2$ | 0 | 1 | 3 | | | | |
| $S_3$ | 3 | 2 | 1 | | | | |

*FIG. 7D* TIME POINT $T_4$

MEMORY
(2bit × 4 × 16)

| | | | | | | | |
|---|---|---|---|---|---|---|---|
| $S_0$ | 0 | 1 | 3 | 2 | | | |
| $S_1$ | 1 | 3 | 2 | 0 | | | |
| $S_2$ | 1 | 3 | 2 | 1 | | | |
| $S_3$ | 1 | 3 | 2 | 1 | | | |

*FIG. 7E* TIME POINT $T_5$

MEMORY
(2bit × 4 × 16)

| | | | | | | | |
|---|---|---|---|---|---|---|---|
| $S_0$ | 1 | 3 | 2 | 1 | 2 | | |
| $S_1$ | 1 | 3 | 2 | 1 | 2 | | |
| $S_2$ | 1 | 3 | 2 | 0 | 1 | | |
| $S_3$ | 1 | 3 | 2 | 1 | 3 | | |

DATA REPRODUCING METHOD AND APPARATUS

BACKGROUND OF THE INVENTION

1. Field of the Invention

The present invention relates to a method and apparatus for reproducing data from a signal read out from a recording medium or transferred by a communication means and, more particularly, to a method and apparatus for reproducing data subjected to convolution based on partial response, by using maximum likelihood.

2. Related Background Art

In recent years, high-density information recording or information transfer at a high transfer rate has become popular for a data reproducing apparatus. For example, a signal processing method called PRML is known as a means for realizing such high-density recording or high transfer rate. The PRML signal processing method uses a combination of PR (Partial Response) and ML (Maximum Likelihood). Partial response is a technique of reproducing data by waveform equalization. A signal read out from a recording medium or transferred by a communication means is output while its waveform is distorted by intercode interference. To properly reproduce data from this signal, the noise component may be removed by filtering. However, the frequency band of the noise component overlaps that of the data signal component over a wide range in fact, and it is therefore difficult to remove the noise component. In partial response, data convolution is performed on the basis of predetermined rules to narrow the band of the data signal, thereby performing data reproduction with a high S/N ratio. The use of partial response allows high-density signal recording in a recording medium and also can cope with an increase in influence of intercode interference on the signal read out from the medium, so that the capacity of information recordable in the recording medium can be increased.

Several schemes are known as partial response, and the above scheme is normally expressed as "PR(1,1)". "PR" is the initials of "partial response". The first "1" in the parentheses represents the original signal, and the second "1" represents that a signal delayed by one bit is superposed on the original signal. Assume a binary signal "010100101100", as shown in FIG. 14A. A signal shown in FIG. 14B, which is delayed by one bit, is superposed on the binary signal, thereby obtaining a signal shown in FIG. 14C. The signal shown in FIG. 14C is called a signal obtained upon waveform equalization by PR(1,1). This signal is a ternary signal with signal amplitude levels "1", "0", and "−1". The signal shown in FIG. 14C has a frequency band narrower than that of the original signal.

Similarly, PR(1,2,1) represents that a signal (FIG. 15B) obtained by delaying a binary signal as shown in FIG. 15A by one bit and doubling its amplitude and a signal (FIG. 15D) obtained by delaying the signal (FIG. 15A) by two bits but with the same amplitude as that of the original signal (FIG. 15A) are superposed on the original binary signal. Consequently, a signal shown in FIG. 15D is obtained. The signal shown in FIG. 15D is called a signal obtained upon waveform equalization by PR(1,2,1). This signal is a quinary signal with signal amplitude levels "2", "1", "0", "−1", and "−2". The signal shown in FIG. 15D has a frequency band narrower than that of the original signal. It can be regarded in PR(1,2,1) that signals obtained upon waveform equalization by PR(1,1) are shifted from each other by one bit, and convolution is further performed.

Maximum likelihood is a technique used when data is to be detected in accordance with information convolution by the above-described partial response. Data with the highest probability is selected to determine the data.

For a signal obtained upon waveform equalization by partial response, a value at a certain time point contains previous information, e.g., information two bits before in PR (1,2,1). For this reason, the original data cannot be determined on the basis of only that value. When maximum likelihood is performed, the data can be properly reproduced from the signal obtained by partial response.

As a specific technique of realizing such maximum likelihood, a matrix method is proposed in, e.g., "A Reliable Signal Detection Method for the Combination of PRML Method and Ternary Recording Code", S. Tazaki, et. al., Proc. '94 IEEE ISIT, p. 214 (June, 1994). The present inventors have filed on an information recording/reproducing apparatus which employs partial response PR(1,1) and reproduces binary digital information by maximum likelihood, which is disclosed in Japanese Patent Application No. 6-181363.

In the former technique, however, a large usable memory must be ensured, and the calculation time is long. In the latter apparatus, detection data is input to a shift register array, and signal processing performed. Data "1" and "0" stored in the shift register correspond to the number of states, so this apparatus can hardly cope with four or more states.

SUMMARY OF THE INVENTION

It is an object of the present invention to provide a data reproducing method and apparatus capable of solving the above problems and performing maximum likelihood with a small memory capacity even when the number of states is large.

In order to achieve the above object, according to the present invention, there is provided a data reproducing apparatus for reproducing data subjected to convolution by partial response, by using maximum likelihood, wherein the data reproducing apparatus comprises memory means including a plurality of memory arrays which respectively correspond to plural states that the data can take and each of which has a predetermined number of regions each corresponding to a time point, detection means for periodically detecting, from the data, states before the plural states have been shifted, and control means for causing values respectively representing the detected states before shifting to be sequentially stored in said regions of said memory arrays every time detection is performed by said detection means, causing the values previously stored in said memory arrays to be replaced in accordance with the detected states before shifting, and when all values stored in said regions of said memory arrays corresponding to the same time point match, reproducing the data on the basis of the matching value.

According to the invention, there is provided a method of reproducing data subjected to convolution by partial response, by using maximum likelihood, in a data reproducing apparatus comprising memory means including a plurality of memory arrays which respectively correspond to plural states that the data can take and each of which has a predetermined number of regions each corresponding to a time point, and detection means for periodically detecting, from the data, states before the plural states have been shifted, wherein the data reproducing method comprises the steps of:

periodically detecting, from the data, the states before the plural states have been shifted by using said detection means;

sequentially storing a value representing the detected state before shifting in each region of said each memory array every time detection is performed by said detection means;

replacing values previously stored in said memory arrays, in accordance with the detected states before shifting; and when all values stored in said regions of said memory arrays corresponding to the same time point match, reproducing the data on the basis of the matching value.

BRIEF DESCRIPTION OF THE DRAWINGS

FIGS. 7A to 7E are views for explaining the operation principle of reproduction/decoding when the states change as shown in FIG. 6 in the apparatus shown in FIG. 1;

DESCRIPTION OF THE PREFERRED EMBODIMENTS

Figure 1:
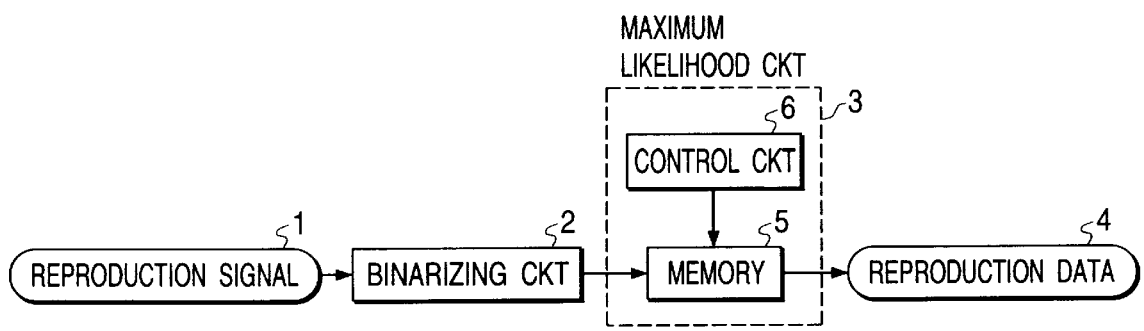
FIG. 1 is a block diagram showing a data reproducing apparatus according to an embodiment of the present invention.

An embodiment of the present invention will be described below in detail with reference to the accompanying drawings. FIG. 1 is a block diagram showing a data reproducing apparatus according to an embodiment of the present invention. Referring to FIG. 1, a reproduction signal 1 is read out from a recording medium (not shown) such as an optical disk, which is a reproduction signal obtained upon waveform equalization by partial response. In this embodiment, partial response PR(1,2,1) is employed. A binarizing circuit 2 detects the level of the reproduction signal 1 and outputs state transition. A maximum likelihood circuit 3 receives an output signal from the binarizing circuit 2, performs maximum likelihood, and outputs reproduction data 4. The maximum likelihood circuit 3 is constituted by a memory 5 and a control circuit 6. The arrangements and operations of the binarizing circuit 2 and the maximum likelihood circuit 3 will be described later in detail.

Figure 2:
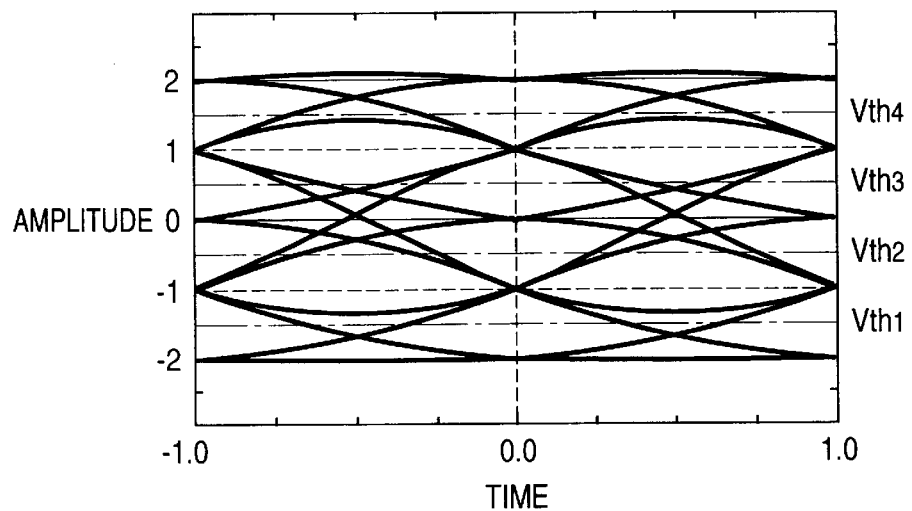
FIG. 2 is a chart showing the waveform of a reproduction signal obtained upon waveform equalization by PR(1,2,1)

FIG. 2 is a chart showing the waveform of the reproduction signal 1 shown in FIG. 1, i.e., a reproduction signal read out from the recording medium and subjected to waveform equalization by partial response. Referring to FIG. 2, the reproduction signal 1 is divided into five values at a data identification point (time: 0.0) by performing information convolution based on waveform equalization by partial response. More specifically, the reproduction signal is divided into five values "−2", "−1", "0", "1", and "2" from the lower amplitude level side. $V_{th1}$ to $V_{th4}$ represent comparison levels for detecting the state transition of the reproduction signal by the binarizing circuit 2 as will be described later. In this embodiment, partial response PR(1,2,1) is employed, as described above. When information convolution is performed by imparting intercode interference by partial response, the reproduction signal as shown in FIG. 2 is obtained. A description of partial response PR(1,2,1) has been made above with reference to FIGS. 15A to 15D.

Figure 3:
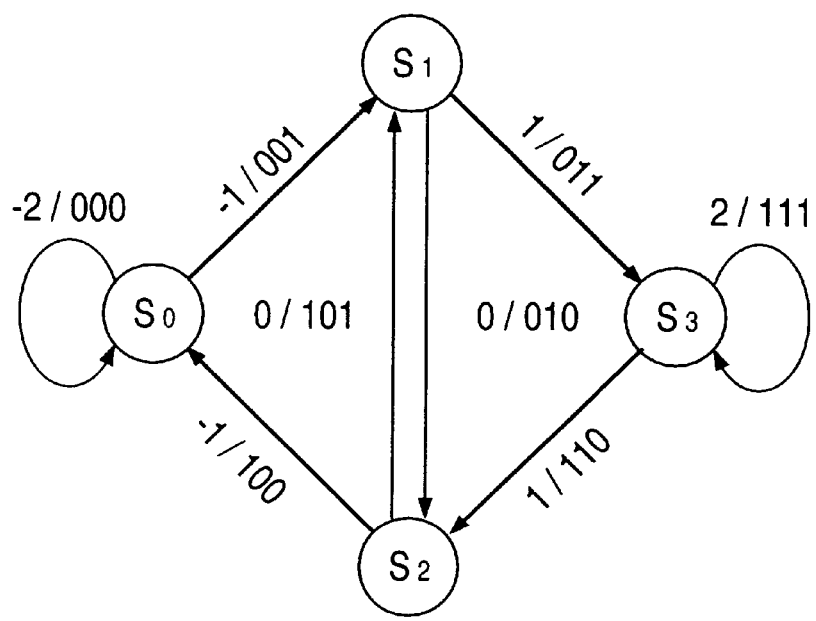
FIG. 3 is a state diagram showing state transition observed when waveform equalization by PR(1,2,1) is performed.

FIG. 3 is a state transition diagram showing state transition of the reproduction signal shown in FIG. 2 in a trellis. In FIG. 3, $S_0$ to $S_3$ represent the states of the reproduction signal. For example, the state $S_0$ follows the state $S_0$ or the state $S_2$, as indicated by arrows. A change from the state $S_0$ to the state $S_0$ is represented by −2/000 in which "−2" represents the detection level at the data identification point shown in FIG. 2, and "000" represents the reproduction data candidate at that time.

In a change from the state $S_2$ to the state $S_0$ as well, "−1" of −1/100 represents the detection level at the data identification point, and "100" represents the reproduction data candidate. The state $S_1$ results from the state $S_0$ or the state $S_2$, the state $S_2$ results from the state $S_1$ or the state $S_3$, and the state $S_3$ results from the state $S_1$ or the state $S_3$, as indicated by arrows. In any case, an arrow represents the direction of state transition together with the detection levels at the data identification point and the reproduction data candidate at that point.

The number of states is determined depending on the manner of convolution by partial response. For example, in PR(1,2,1), convolution of information two bits before is made, so that the number of states is 2×2=4. When convolution of information n bits before is made, the number of states is $2^n$.

Figure 4:
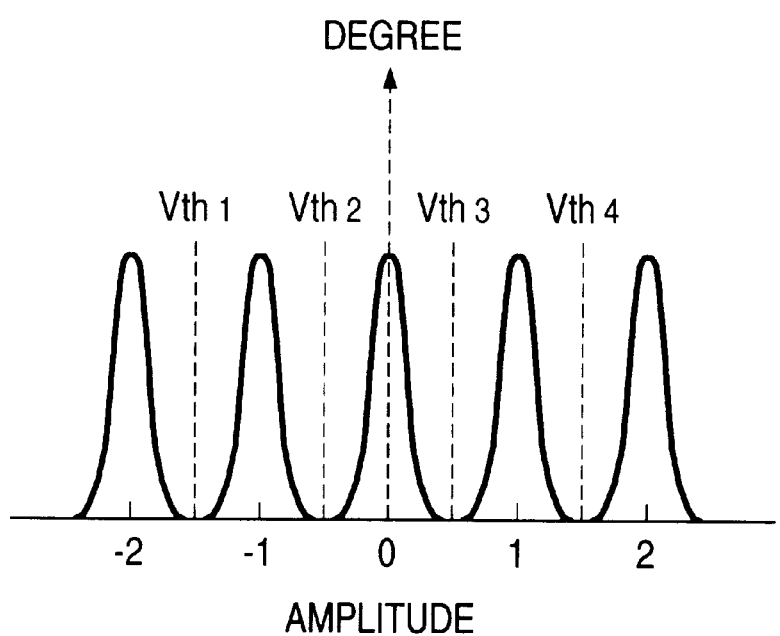
FIG. 4 is a graph showing a distribution of the reproduction signal at data identification points, which is observed when waveform equalization by PR(1,2,1) is performed.

FIG. 4 is a graph showing the reproduction signal amplitude distribution at the data identification point shown in FIG. 2. As is apparent from FIG. 4, the reproduction signal amplitude distribution is a Gaussian distribution having peaks at amplitude levels "−2", "−1", "0", "1", and "2". The width of the Gaussian distribution can be considered to be determined by the S/N ratio of the reproduction signal. As for state transition from a certain time point to the next time point, which has been described above with reference to FIG. 3, transition with a high probability is selected in accordance with the Gaussian distribution shown in FIG. 4. In maximum likelihood, a reproduction data string with the highest probability is selected by selecting state transition, thereby reproducing data.

Figure 5:
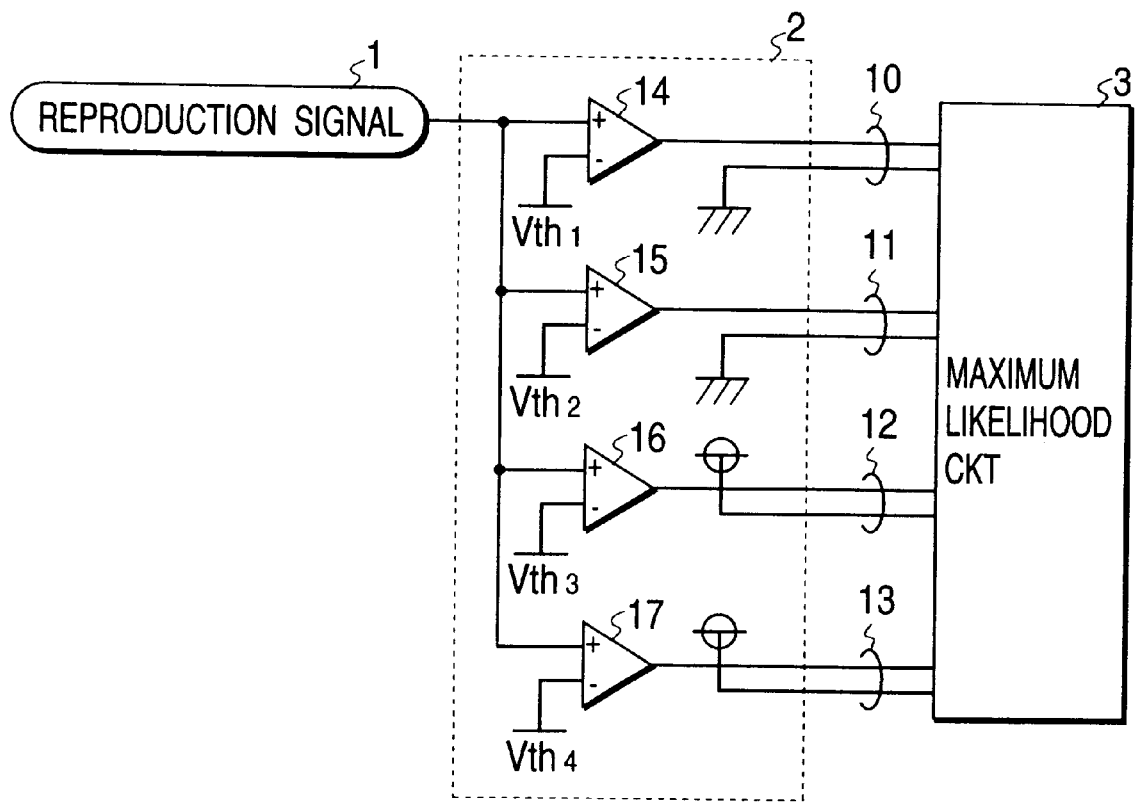
FIG. 5 is a circuit diagram showing an arrangement of the binarizing circuit of the apparatus shown in FIG. 1.

FIG. 5 is a circuit diagram showing an arrangement of the binarizing circuit 2 in detail. The binarizing circuit 2 comprises four comparators 14 to 17. Each comparator compares the reproduction signal 1 with a predetermined comparison level, and outputs the comparison result. The reproduction signal 1 is a reproduction signal obtained upon waveform equalization, as described above. The comparison level $V_{th1}$ is input to the comparator 14, the comparison level $V_{th2}$ is input to the comparator 15, the comparison level $V_{th3}$ is input to the comparator 16, and the comparison level $V_{th4}$ is input to the comparator 17. Each comparator compares the reproduction signal with the comparison level and outputs the comparison result to the maximum likelihood circuit 3. The comparison levels $V_{th1}$ to $V_{th4}$ correspond to those shown in FIGS. 2 and 4.

The comparator 14 compares the reproduction signal with the comparison level $V_{th1}$ in FIG. 2 at the data identification point and outputs the comparison result. In this case, when the amplitude level of the reproduction signal at the data identification point is higher than the comparison level $V_{th1}$, there is a high probability that the amplitude level of the reproduction signal at the data identification point is "−1" rather than "−2", as is apparent from FIG. 4. To the contrary, when the amplitude level of the reproduction signal at the data identification point is lower than the comparison level $V_{th1}$, there is a high probability that the amplitude level of the reproduction signal at the data identification point is "−2" rather than "−1".

This difference corresponds to determination of state transition described above with reference to the state diagram of FIG. 3, i.e., whether the state before the state $S_0$ is the state $S_0$ or the state $S_2$. More specifically, the comparator 14 compares the reproduction signal with the comparison level $V_{th1}$ as shown in FIG. 2 to detect the level of the reproduction signal at the data identification point and outputs data representing the state before the state $S_0$, i.e., the state $S_0$ or the state $S_2$. In this manner, the comparator 14 detects the level of the reproduction signal, detects the state transition on the basis of the level of the reproduction signal, and outputs the detection result from its output terminal and ground line to the maximum likelihood circuit 3 as an output 10, i.e., 2-bit data "00" or "10".

The comparator 15 compares the reproduction signal with the comparison level $V_{th2}$ in FIG. 2 and outputs the comparison result. In this case as well, as in the above description, when the amplitude level of the reproduction signal at the data identification point is higher than the comparison level $V_{th2}$, there is a high probability that the amplitude level of the reproduction signal at the data identification point is "0" rather than "−1", as is apparent from FIG. 4. To the contrary, when the amplitude level of the reproduction signal at the data identification point is lower than the comparison level $V_{th2}$, there is a high probability that the level of the reproduction signal at the data identification point is "−1" rather than "0". This difference also corresponds to determination in the state diagram of FIG. 3, i.e., whether the state before the state $S_1$ is the state So or the state $S_2$. The comparator 15 compares the reproduction signal with the comparison level $V_{th2}$, detects the level of the reproduction signal at the data identification point, and outputs data representing the state before the state $S_1$, i.e., the state $S_0$ or the state $S_2$. This data is output from the output terminal and ground line of the comparator 15 to the maximum likelihood circuit 3 as an output 11, i.e., 2-bit data "00" or "10".

The comparator 16 compares the reproduction signal with the comparison level $V_{th3}$ in FIG. 2 and outputs the comparison result to the maximum likelihood circuit 3. In this case as well, when the amplitude level of the reproduction signal at the data identification point is higher than the comparison level $V_{th3}$, there is a high probability that the level of the reproduction signal at the data identification point is "1" rather than "0", as is apparent from FIG. 4. To the contrary, when the amplitude level of the reproduction signal at the data identification point is lower than the comparison level $V_{th3}$, there is a high probability that the level of the reproduction signal at the data identification point is "0" rather than "1". This difference also corresponds to determination in the state diagram of FIG. 3, i.e., whether the state before the state $S_2$ is state $S_1$ or the state $S_3$. The comparator 16 compares the reproduction signal with the comparison level $V_{th3}$, detects the level of the reproduction signal at the data identification point, and outputs data representing the state before the state $S_2$, i.e., the state $S_1$ or the state $S_3$. This data is output from the output terminal and power supply line of the comparator 16 to the maximum likelihood circuit 3 as an output 12, i.e., 2-bit data "01" or "11".

Finally, the comparator 17 compares the reproduction signal with the comparison level $V_{th4}$ in FIG. 2. In this case as well, when the amplitude level of the reproduction signal at the data identification point is higher than the comparison level $V_{th4}$, there is a high probability that the level of the reproduction signal at the data identification point is "2" rather than "1", as is apparent from FIG. 4. To the contrary, when the amplitude level of the reproduction signal at the data identification point is lower than the comparison level $V_{th4}$, there is a high probability that the level of the reproduction signal at the data identification point is "1" rather than "2". This difference also corresponds to determination in the state diagram of FIG. 3, i.e., whether the state before the state $S_3$ is the state $S_1$ or the state $S_3$. The comparator 17 compares the reproduction signal with the comparison level $V_{th4}$, detects the level of the reproduction signal at the data identification point, and outputs data representing the state before the state $S_3$, i.e., the state $S_1$ or the state $S_3$. This data is output from the output terminal and power supply line of the comparator 17 to the maximum likelihood circuit 3 as an output 13, i.e., 2-bit data "01" or "11". As described above, the binarizing circuit 2 detects the level of the reproduction signal at the data identification point by using the four comparators and outputs the detection result to the maximum likelihood circuit 3 as the state transition of the reproduction signal.

Figure 6:
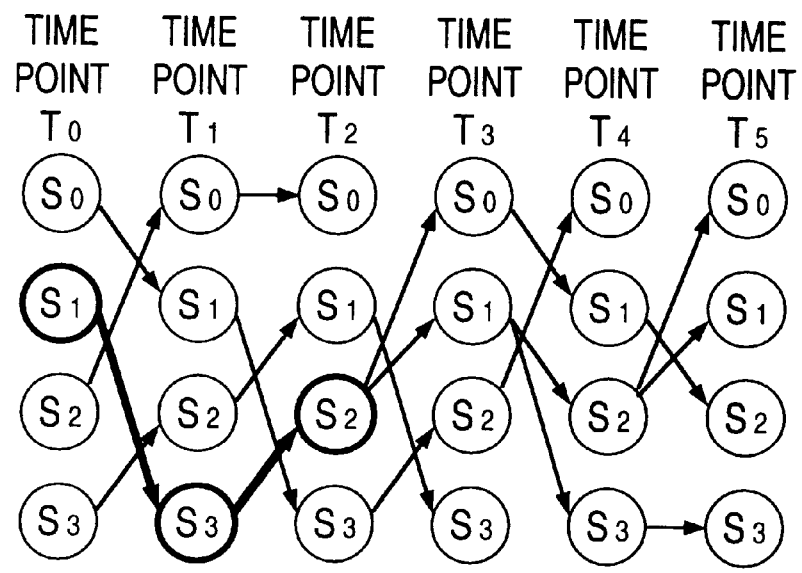
FIG. 6 is a trellis diagram showing an example of state transition of the reproduction signal.

The above operation will be described in more detail. One of the states $S_0$ to $S_3$, from which each of the four states $S_0$ to $S_3$ has changed at a time point $T_1$, is detected in the following manner. First, the state $S_0$ changes from the state $S_0$ or the state $S_2$, as can be seen from FIG. 3. When the signal level at the time point $T_1$ is "−1", the state $S_0$ has changed from the state $S_2$, and when the signal level is "−2", the state $S_0$ has changed from the state $S_0$, as is apparent from FIG. 3. When the output from the comparator 14 shown in FIG. 5 is "10", there is a high probability that the signal level at the time point $T_1$ is "−1", and it is therefore determined that the state $S_0$ has changed from the state $S_2$ at the time point $T_1$, as shown in FIG. 6. Similarly, it is determined that the state $S_1$ has changed from the state $S_0$, the state $S_2$ has changed from the state $S_3$, and the state $S_3$ has changed from the state $S_1$. In this manner, state transition is periodically detected on the basis of the outputs from the binarizing circuit 2.

The operation principle of the maximum likelihood circuit 3 will be described below with reference to FIGS. 6 and 7A to 7E. In this embodiment, a maximum likelihood operation performed when the states have changed as shown in the trellis diagram of FIG. 6 will be described. FIG. 6 shows state transition detected by the binarizing circuit 2, as described above. FIGS. 7A to 7E are views showing the contents of data stored in the memory 5 in correspondence with the state transition. Time points $T_1$ to $T_5$ in FIGS. 7A to 7E correspond to time points $T_1$ to $T_5$ in FIG. 6. As described above in FIG. 1, the maximum likelihood circuit 3 is constituted by the memory 5 and the control circuit 6 for controlling data storage in the memory 5. The memory 5 has four 2-bit memories in correspondence with the four states shown in FIG. 6. The four 2-bit memories corresponding to 16 clocks are time-serially ensured. The path memory length of the memory 5 may be three or more times the number of states. In this case, a path memory length corresponding to 16 clocks is provided.

The operation principle will be described in detail. At the time point $T_1$ in FIG. 6, the state $S_0$ has changed from the state $S_2$, as indicated by an arrow. In this case, as shown in FIG. 7A, data "2" representing that the state $S_0$ has changed from the state $S_2$ is stored in a memory corresponding to the state $S_0$ by the control circuit 6. Similarly, at the time point $T_1$, the state $S_1$ has changed from the state $S_0$, the state $S_2$ has changed from the state $S_3$, and the state $S_3$ has changed from the state $S_1$. Therefore, data "0", "3", and "1" are stored in memories corresponding to the state $S_1$, the state $S_2$, and the state $S_3$, respectively, by the control circuit 6, as shown in FIG. 7A.

At the time point $T_2$, the state $S_0$ has changed from the state $S_0$, as shown in FIG. 6. Therefore, data "0" representing that the state $S_0$ has changed from the state $S_0$ is stored in the memory corresponding to the state $S_0$, as shown in FIG. 7B (second column). Similarly, the state $S_1$ has changed from the state $S_2$, the state $S_2$ has changed from the state $S_3$, and the state $S_3$ has changed from the state $S_1$. Therefore, data "2", "3", and "1" are stored in the memories corresponding to the states $S_1$, $S_2$, and $S_3$, respectively, as shown in FIG. 7B. Similarly, the control circuit 6 performs processing of shifting the data stored in the memory 5 at the time point $T_1$ in accordance with the data stored at the time point $T_2$.

More specifically, since the state $S_0$ has changed from the state $S_0$ at the time point $T_2$, the data for the state $S_0$ at the time point $T_1$ is transferred as data corresponding to the state $S_0$. That is, since the data "2" is stored in correspondence with the state $S_0$ at the time point $T_1$, the control circuit 6 stores the data "2" in the memory corresponding to the state $S_0$, as shown in FIG. 7B (first column). At the time point $T_2$, the state $S_1$ has changed from the state $S_2$, the state $S_2$ has changed from the state $S_3$, and the state $S_3$ has changed from the state $S_1$. Therefore, the data "3" for the state $S_2$ at the time point $T_1$ is stored as data corresponding to the state $S_1$, the data "1" for the state $S_3$ at the time point $T_1$ is stored as data corresponding to the state $S_2$, and the data "0" for the state $S_1$ at the time point $T_1$ is stored as data corresponding to the state $S_3$.

Similar processing is performed at the time point $T_3$. The state $S_0$ has changed from the state $S_2$, so that the data "2" is stored in the memory corresponding to the state $S_0$, as shown in FIG. 7C (third column). Similarly, the state Si has changed from the state $S_2$, the state $S_2$ has changed from the state $S_3$ and the state $S_3$ has changed from the state $S_1$. Therefore, as shown in FIG. 7C (third column), the data "2", "3", and "1" are stored in the memories corresponding to the states $S_1$, $S_2$, and $S_3$ respectively. At the same time, the data stored at the time points $T_1$ and $T_2$ are shifted in accordance with the data at the time point $T_3$.

More specifically, when the data at the time point $T_2$ are to be shifted in accordance with the data at the time point $T_3$, the data "3" for the state $S_2$ at the time point $T_2$ is stored in the memory corresponding to the state $S_0$, as shown in FIG. 7C (second column), because the state $S_0$ has changed from the state $S_2$ at the time point $T_3$. Similarly, at the time point $T_3$, the state $S_1$ has changed from the state $S_2$, the state $S_2$ has changed from the state $S_3$, and the state $S_3$ has changed from the state $S_1$. Therefore, as shown in FIG. 7C (second column), the data "3" for the state $S_2$ at the time point $T_2$ is stored in the memory corresponding to the state $S_1$, the data "1" for the state $S_3$ at the time point $T_2$ is stored in the memory corresponding to the state $S_2$, and the data "2" for the state $S_1$ at the time point $T_2$ is stored in the memory corresponding to the state $S_3$. The data are shifted in the memory 5 in the this manner. As a result, data of the second column in the memory is represented as "3", "3", "1", and "2", as shown in FIG. 7C.

When the data at the time point $T_1$ are to be shifted in accordance with the data at the time point $T_3$, the data "1" for the state $S_2$ at the time point $T_1$ is stored as data corresponding to the state $S_0$, as shown in the first column of FIG. 7C, because the state $S_0$ has changed from the state $S_2$ at the time point $T_3$. Similarly, at the time point $T_3$, the state $S_1$ has changed from the state $S_2$, the state $S_2$ has changed from the state $S_3$, and the state $S_3$ has changed from the state $S_1$. Therefore, as shown in the first column of FIG. 7C, the data "1" for the state $S_2$ at the time point $T_1$ is stored in the memory corresponding to the state $S_1$, the data "0" for the state $S_3$ at the time point $T_1$ is stored in the memory corresponding to the state $S_2$, and the data "3" for the state $S_1$ at the time point $T_1$ is stored in the memory corresponding to the state $S_3$. As a result, data of the first column of the memory 5 is represented as "1", "0", and "3", as shown in FIG. 7C.

At the time point $T_4$ as well, the same processing as described above is performed. At the time point $T_4$, the state $S_0$ has changed from the state $S_2$, the state $S_1$ has changed from the state $S_0$, the state $S_2$ has changed from the state $S_1$, and the state $S_3$ has changed from the state $S_1$. Therefore, as shown in FIG. 7D (fourth column), "2", "0", "1", and "1" are stored in the memories corresponding to the states $S_0$, the state $S_1$, the state $S_2$, and the state $S_3$, respectively. In addition, the data stored at the time points $T_1$, $T_2$, and $T_3$ are shifted in accordance with the data stored in the time point $T_4$. This processing is performed on the basis of the same principle as described above. When the data at the time point $T_3$ are shifted in accordance with the data at the time point $T_4$, "3" is stored in the memory corresponding to the state $S_0$, "2" is stored in the memory corresponding to the state $S_1$, "2" is stored in the memory corresponding to the state $S_2$, and "2" is stored in the memory corresponding to the state $S_3$, as shown in FIG. 7D (third column).

The data stored at the time point $T_2$ are shifted in accordance with the data at the time point $T_4$ on the basis of the same principle as described above. As shown in FIG. 7D (second column), "1" is stored in the memory corresponding to the state $S_0$, the "3" is stored in the memory corresponding to the state $S_1$, "3" is stored in the memory corresponding to the state $S_2$, and "3"is stored in the memory corresponding to the state $S_3$. When the data at the time point $T_1$ are shifted in accordance with the data at the time point $T_4$ on the basis of the same principle, "0" is stored in the memory corresponding to the state $S_0$, "1" is stored in the memory corresponding to the memory state $S_1$, "1" is stored in the memory corresponding to the state $S_2$, and "1"is stored in the memory corresponding to the state $S_3$, as shown in FIG. 7D (first column).

The same processing is performed at the time point $T_5$ as well. At the time point $T_5$, the state $S_0$ has changed from the state $S_2$, the state $S_1$ has changed from the state $S_2$, the state $S_2$ has changed from the state $S_1$, and the state $S_3$ has changed from the state $S_3$. Therefore, as shown in FIG. 7E (fifth column), "2" is stored in the memory corresponding to the state $S_0$, "2" is stored in the memory corresponding to the state $S_1$, "1"is stored in the memory corresponding to the state $S_2$, and "3" is stored in the memory corresponding to the state $S_3$. In addition, the data stored at the time point $T_4$ are shifted in accordance with the data at the time point $T_5$ on the basis of the same principle as described above. As a result, "1" is stored in the memory corresponding to the state $S_0$, "1" is stored in the memory corresponding to the memory state $S_1$, "0" is stored in the memory corresponding to the state $S_2$, and "1"is stored in the memory corresponding to the state $S_3$, as shown in FIG. 7E (fourth column).

The data at the time point $T_3$ are shifted in accordance with the data at the time point $T_5$. As shown in the third column in FIG. 7E, "2" is stored in all the memories corresponding to the states $S_0$ to $S_3$. When the data at the time point $T_2$ are shifted in accordance with the data at the time point $T_5$, "3" is stored in all the memories corresponding to the states $S_0$ to $S_3$, as shown in the second column in FIG. 7E. When the data at the time point $T_1$ are shifted in accordance with the data at the time point $T_5$, "1" is stored in all the memories corresponding to the states $S_0$ to $S_3$, as shown in the first column in FIG. 7E. In this manner, the control circuit 6 controls the data in the memory 5 in accordance with the state transition.

As is apparent from FIG. 7E, at the time point $T_5$, the contents of data stored in the memory before the time point $T_3$ match in the memories corresponding to all the states. More specifically, at the time point $T_2$, "2" is stored in all the memories corresponding to the states $S_0$ to $S_3$. At the time point $T_1$, "3" is stored in all the memories corresponding to the states $S_0$ to $S_3$. At a time point $T_0$, "1" is stored in all the memories corresponding to the state $S_0$ to $S_3$. This means that the state has changed from the state $S_2$ at the time point $T_2$, from the state $S_3$ at the time point $T_1$, and from the state $S_1$ at the time point $T_0$. Consequently, as is apparent from the state diagram shown in FIG. 3, since the data for the state $S_2$ is "10", the data for the state $S_3$ is "11", and the data for the state $S_1$ is "01", the reproduction data can be determined as "0110".

Figure 8:
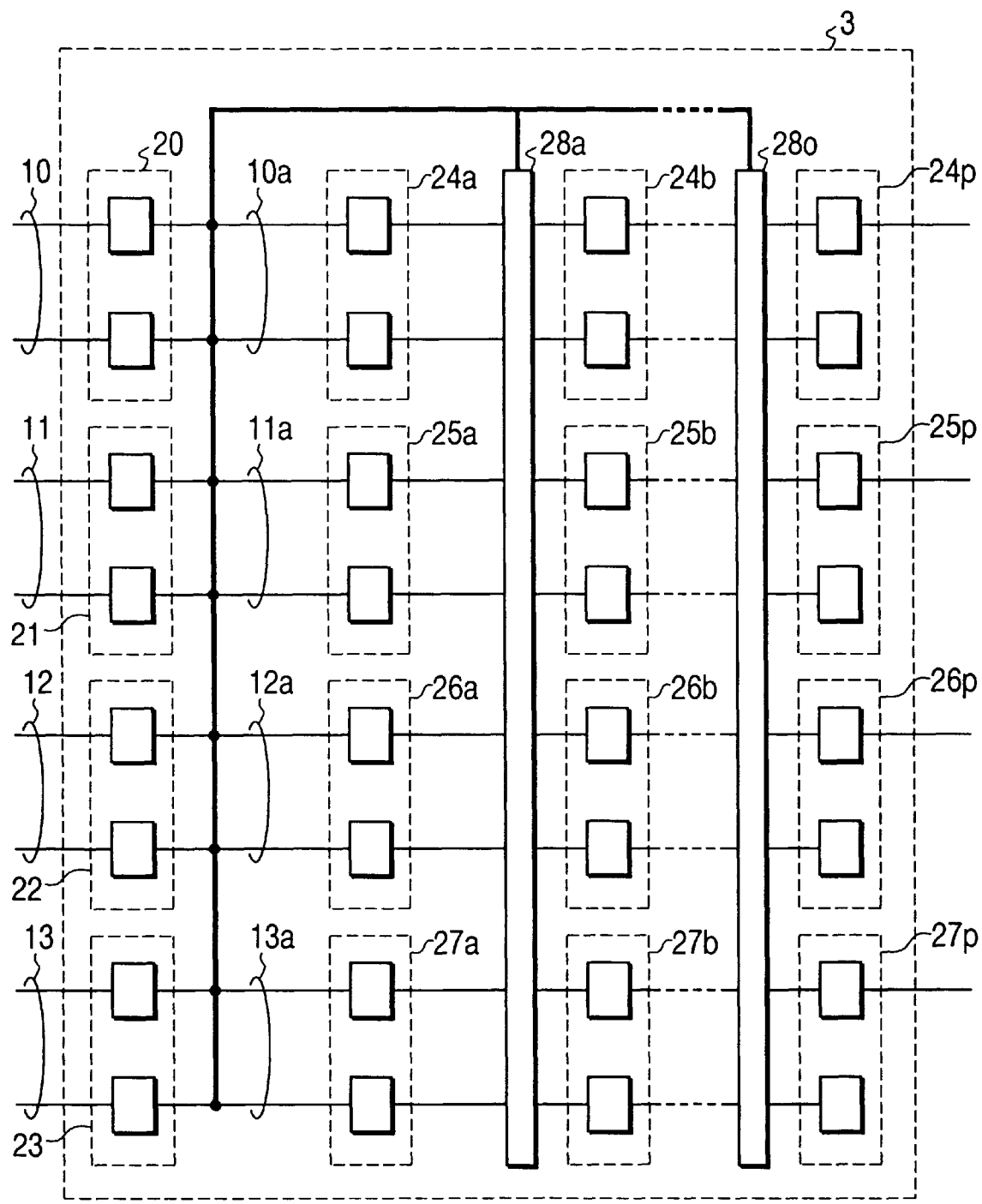
FIG. 8 is a circuit diagram showing an arrangement of the maximum likelihood circuit of the apparatus shown in FIG. 1.

A detailed arrangement of the maximum likelihood circuit 3 will be described below. FIG. 8 is a circuit diagram showing an example of the maximum likelihood circuit 3. Referring to FIG. 8, the inputs 10 to 13 correspond to the outputs from the binarizing circuit 2 shown in FIG. 5. These outputs are input to the corresponding memory arrays of the memory 5 in the maximum likelihood circuit 3, respectively. More specifically, the output 10 is input to a memory array consisting of 2-bit memories 20 to 24p corresponding to the state $S_0$, the output 11 is input to a memory array consisting of 2-bit memories 21 to 25p corresponding to the state $S_1$, the output 12 is input to a memory array consisting of 2-bit memories 22 to 26p corresponding to the state $S_2$, and the output 13 is input to a memory array consisting of 2-bit memories 23 to 27p corresponding to the state $S_3$. As the path memory length of each memory array, a length corresponding to 16 clocks is ensured, as described above. In addition, select circuits 28a to 28o for shifting data are arranged between the memories of each memory array (to be described later in detail).

Figure 9:
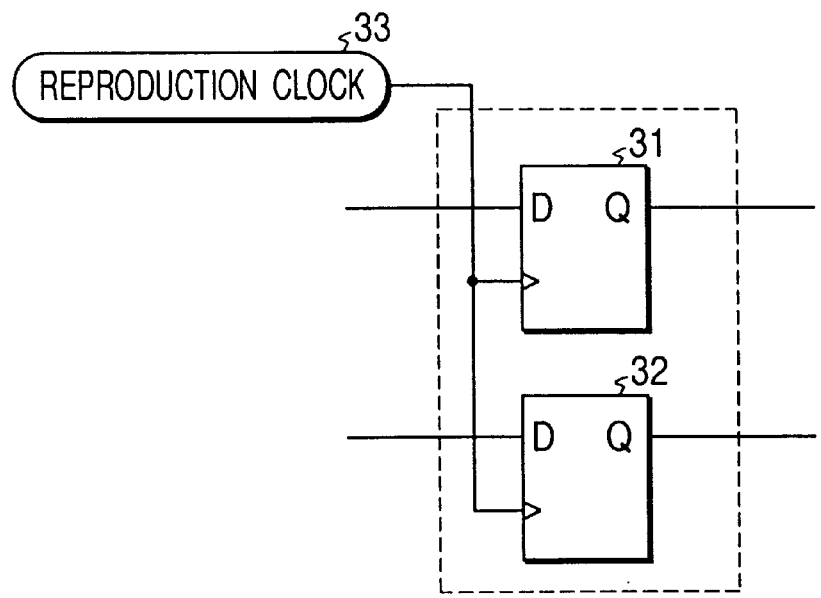
FIG. 9 is a circuit diagram showing an arrangement of a 2-bit memory used in the maximum likelihood circuit shown in FIG. 8.

As the 2-bit memory, two DFFs (data flip-flops) 31 and 32 are used, as shown in FIG. 9. A reproduction clock 33 is input from a PLL circuit (not shown) to the two DFFs 31 and 32, so that data is shifted by this reproduction clock. The data input to the 2-bit memories 20 to 23 are output as outputs 10a, 11a, 12a, and 13a in synchronism with the reproduction clock. These outputs are input to the next 2-bit memories 24a, 25a, 26a, and 27a. These 2-bit memories have the same arrangement as shown in FIG. 9. The 2-bit memories 24a, 25a, 26a, and 27a are respectively connected to 2-bit memories 24b, 25b, 26b, and 27b through the select circuit 28a. When data are to be shifted, as described above, the select circuit 28a shifts the data by switching connection of the memories.

Figure 10:
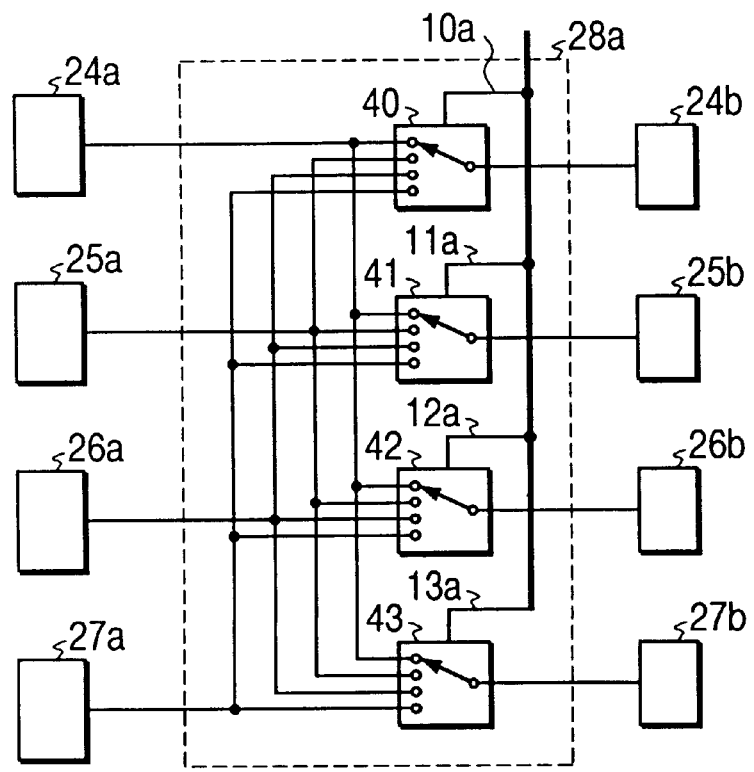
FIG. 10 is a circuit diagram showing an arrangement of a select circuit used in the maximum likelihood circuit shown in FIG. 1.

FIG. 10 is a circuit diagram showing an arrangement of the select circuit 28a. The select circuit 28a is constituted by four multiplexers 40 to 43 corresponding to the states $S_0$ to $S_3$. The multiplexers 40 to 43 are connected to the input-side memories 24a, 25a, 26a, and 27a, respectively, so that the data in the memories are shifted in accordance with the switching operation of the multiplexers 40 to 43.

In this case, the switching operation of the multiplexers 40 to 43 is controlled such that the data stored in the memories 24a, 25a, 26a, and 27a are shifted in accordance with the corresponding outputs 10a, 11a, 12a, and 13a, i.e., currently input data. Though not illustrated in FIG. 8, the control circuit 6 controls the switching operation of the multiplexers.

At the time point $T_1$ in FIG. 6, the memory 5 stores data contents as shown in FIG. 7A. In fact, these data are positioned at the second memory of each memory array shown in FIG. 8. More specifically, at the time point $T_1$, "2" is stored in the memory 24a, "0" is stored in the memory 25a, "3" is stored in the memory 26a, and "1" is stored in the memory 27a. In this state, the next data shown in the second column of FIG. 7B are input to the memory array, so that "0" is stored in the memory 20, "2" is stored in the memory 21, "3" is stored in the memory 22, and "1" is stored in the memory 23. At this time, the select circuit 28a shifts the data at the time point $T_1$ in accordance with the data input at that time under the control of the control circuit 6, as in the above description of the operation principle. More specifically, since the data input to the memory array corresponding to the state $S_0$ is "0", data corresponding to the state $S_0$ at the time point $T_1$, i.e., "2" stored in the memory 24a is shifted to the next memory 24b corresponding to the state $S_0$. The data is shifted by connecting the memories 24a and 24b through the multiplexer 40 in the select circuit 28a.

The data input to the memory array corresponding to the state $S_1$ is "2". Similarly, data corresponding to the state $S_2$, i.e., "3" stored in the memory 26a is shifted to the next memory 25b corresponding to the state $S_1$. In this case, the memories 26a and 25b are connected through the multiplexer 41. The data input to the memory array corresponding to the state $S_2$ is "3", and the data corresponding to the state $S_3$,i.e., "1" as the data stored in the memory 27a is shifted to the next memory 26b. At this time, the memories 27a and 26b are connected through the multiplexer 42. Finally, the data "1" is input to the memory array corresponding to the state $S_3$. The data corresponding to the state $S_1$, i.e., "0" stored in the memory 25a is shifted to the next memory 27b. At this time, the memories 25a and 27b are connected through the multiplexer 43. The select circuit 28a shifts the data in this manner.

In the respective memory arrays, a select circuit is connected to the memories 24b, 25b, 26b, and 27b, 2-bit memories are connected to the select circuit, and another select circuit is connected the 2-bit memories. In this manner, memories and select circuits are alternately arranged, and 2-bit memories 24p, 25p, 26p, and 27p are arranged at the end of the memory arrays. The data shift operation in the memories by the select circuit 28a has been described above. At the subsequent memories of the memory arrays, the control circuit 6 controls each select circuit to shift the data in accordance with the corresponding data inputs, as in the description of the operation principle with reference to FIGS. 6 and 7. In each memory array, data is sequentially shifted in synchronism with the reproduction clock. As in the above description of the operation principle, when data are output to the memory 24p, 25p, 26p, and 27p at the output stage, the data contents match for all the states. Therefore, when upper or lower bits are extracted from the 2-bit memories 24p, 25p, 26p, and 27p at the output stage, reproduction data can be obtained.

As described above, in this embodiment, information can be reproduced using the memory arrays corresponding to the number of the states of the reproduction signal and the memory 5 having a predetermined path memory length. Maximum likelihood can be performed with a smaller memory capacity than that of the prior art. When the number of states is large, the number of memory arrays of the memory 5 is increased accordingly. With this arrangement, maximum likelihood can be similarly performed, so this arrangement can cope with a large number of states.

Figure 11:
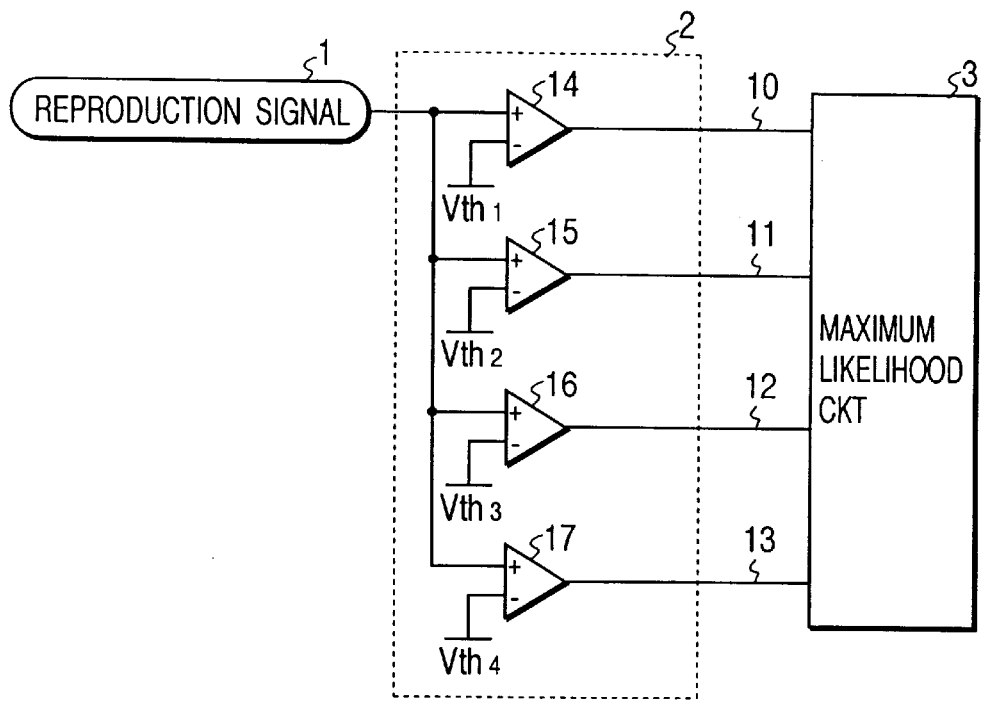
FIG. 11 is a circuit diagram showing another arrangement of the binarizing circuit of the apparatus shown in FIG. 1.

Another embodiment of the present invention will be described below. As shown in the state diagram of FIG. 3, the number of state transitions is two. Therefore, the number of bits necessary to transfer state transition can be one instead of two. In this embodiment, data corresponding to each state is represented by one bit. FIG. 11 is a circuit diagram showing a binarizing circuit 2 used in this embodiment. In this binarizing circuit, each of comparators 14 to 17 outputs one signal, i.e., 1-bit data representing state transition to a maximum likelihood circuit 3. The operation of the binarizing circuit 2 is the same as in the first embodiment shown in FIG. 5.

Figure 13:
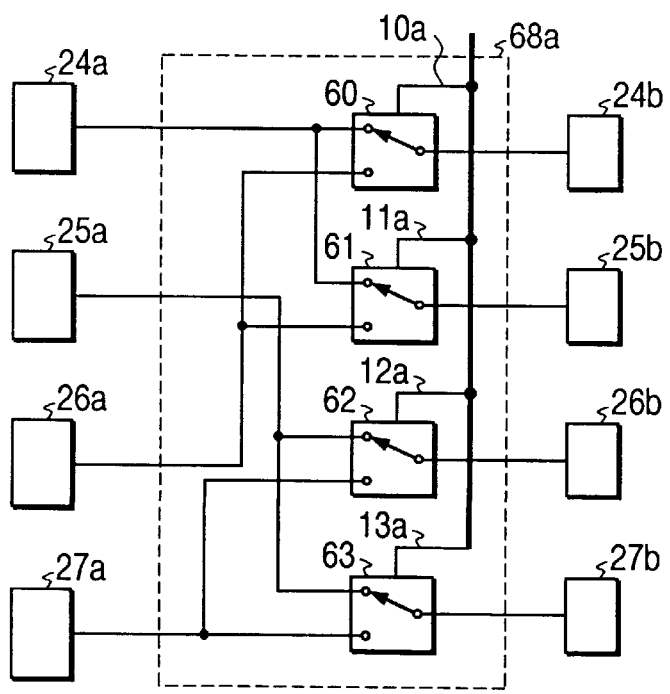
FIG. 13 is a circuit diagram showing an arrangement of a select circuit used in the maximum likelihood circuit shown in FIG. 12.
Figure 12:
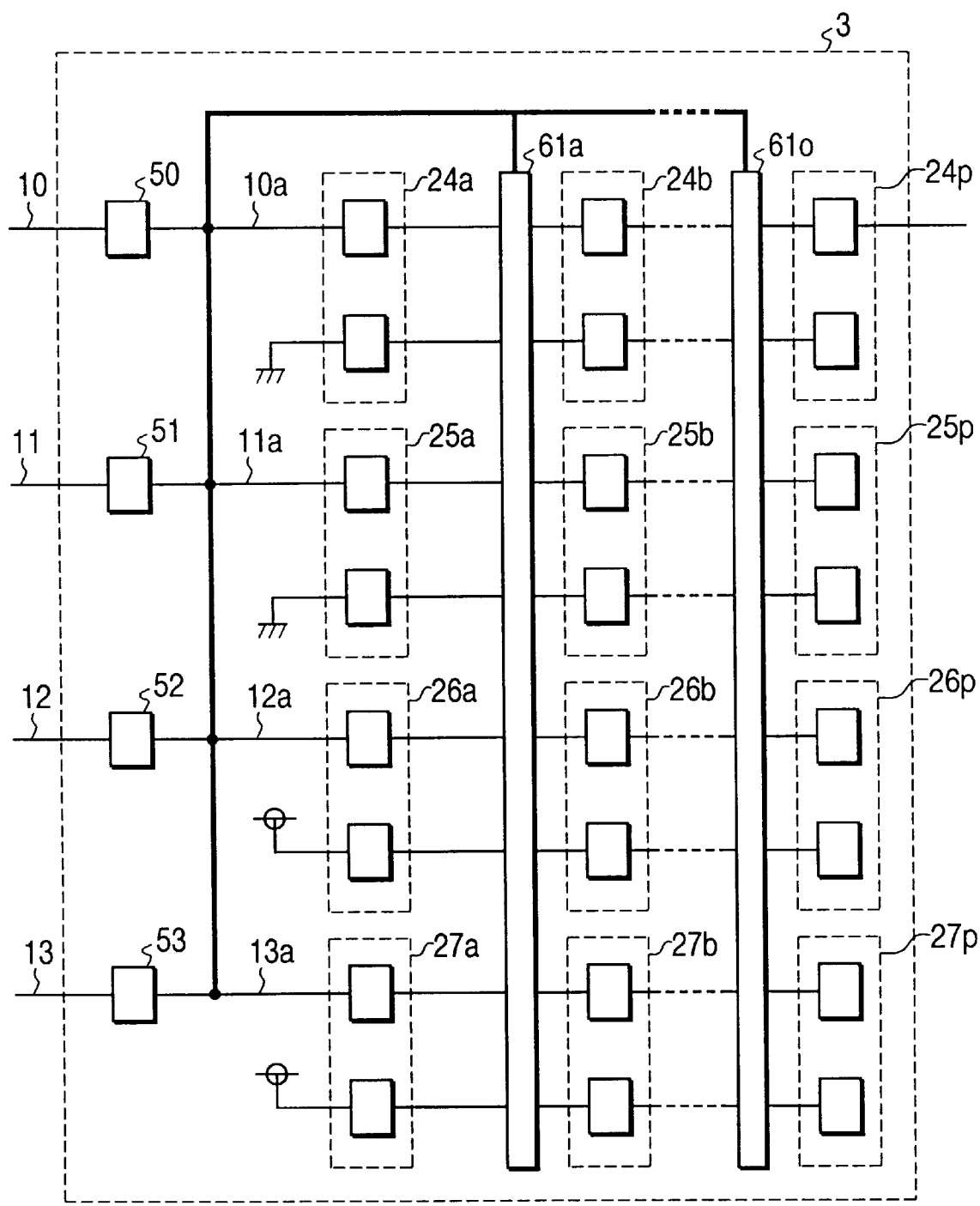
FIG. 12 is a circuit diagram showing another arrangement of the maximum likelihood circuit of the apparatus shown in FIG. 1.
Figure 14A:
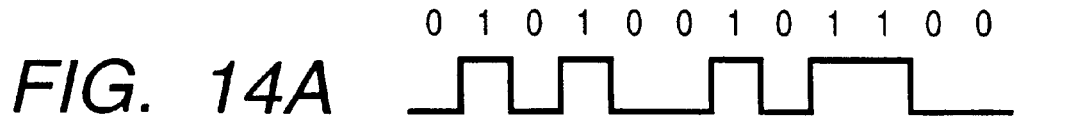
FIGS. 14A to 14C are views for explaining waveform equalization by PR(1,1)
Figure 14B:
Figure 14C:
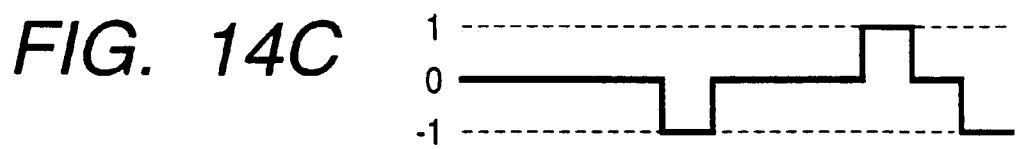
Figure 15A:
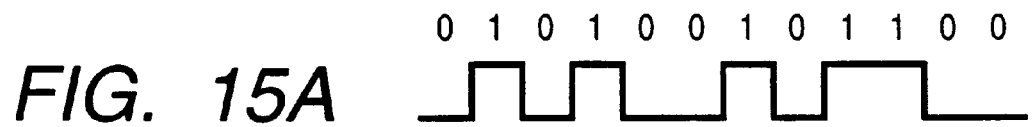
FIGS. 15A to 15D are views for explaining waveform equalization by PR(1,2,1).
Figure 15B:
Figure 15C:
Figure 15D:
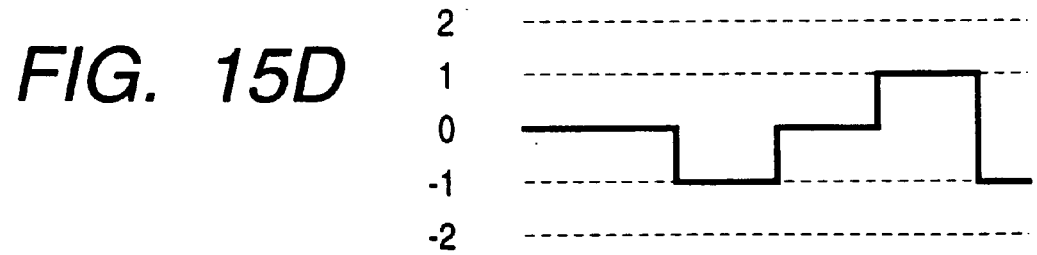

FIG. 12 is a circuit diagram showing the maximum likelihood circuit 3 used in this embodiment. In this case as well, 1-bit memories 50 to 52 are arranged in place of the 2-bit memories 20 to 23 of the first embodiment. Select circuits 68a to 68o are also different from those of the first embodiment. FIG. 13 shows the select circuit of this embodiment. In FIG. 13, since the number of state transitions is two, each of multiplexers 60 to 63 has two input terminals. The operation of the maximum likelihood circuit shown in FIG. 12 is the same as in the first embodiment. In this embodiment, 1-bit data is processed. Therefore, the memory capacity can be further decreased as compared to the first embodiment, and the circuit arrangement can be simplified.

What is claimed is:

1. A data reproduction apparatus for performing partial response detection of a reproduction signal and reproducing data by using maximum likelihood decoding, comprising:

N×M memory arrays with N memory lines each corresponding to state values $S_k$ (k=0, 1, ..., N-1) in state transition and M memory rows (a, ..., p) storing a maximum likelihood path;

a signal sampler, adapted to sample a reproduction signal at a data identification point t so as to detect the reproduction signal level on the basis of a relationship (state transition diagram) between the state values $S_k$ (k=0, 1, ..., N-1) corresponding to a detection value of said reproduction signal level;

a storer, adapted to store in each respective one of the memory lines corresponding to each respective state value $S_k$ (k=0, 1, ..., N-1) for said memory array, the state values at a data identification point t, $S_k^t$ (k=0, 1, ..., N-1) detected from detection level values at said data identification point t, immediately before they are linked by one branch of maximum likelihood path; and a controller, adapted to rewrite the state value stored in each memory line as the state value which has been linked by the state values $S_k^t$ (k=0,1, ..., N-1), detected at the data identification point t and the branch of maximum likelihood path, in order back to each data identification point (t-1, t-2, ..., t-(M-1)), wherein the rewriting control of the state value is performed so that the transitions of the state values up to the data identification point t are stored in the sequential memory lines for each identification of the reproduction signal in each memory line corresponding to each state value $S_k$ (k=0, 1, ..., N-1), and the reproduced data corresponding to the change of the state values in the M-th row to the state values in the (M-1)-th row are output.

2. An apparatus according to claim 1, wherein the number of rows, M of said memory arrays is at least three times the number of lines, N of said memory arrays.

3. An apparatus according to claim 1, wherein the data is subjected to convolution based on PR(1,2,1).

4. An apparatus according to claim 1, wherein detection level values are detected by means of a plurality of comparators for comparing the data with a plurality of threshold values and outputting comparison results to said controller.

5. An apparatus according to claim 1, wherein said N×M memory arrays comprise a plurality of parallelly arranged memory arrays each having a plurality of series-connected 2-bit memories and selectors, arranged between said 2-bit memories, for replacing values stored in said 2-bit memories.

6. An apparatus according to claim 5, wherein said 2-bit memory comprises two data flip-flops which are parallelly arranged.

7. An apparatus according to claim 5, wherein said select means comprises a plurality of multiplexers for switching connection of said plurality of memory arrays.

8. An apparatus according to claim 1, further comprising a state detector, adapted to detect whether the N state values in said memory row are all coincident, wherein the reproduced data corresponding to said coincident state values is output.

9. A data reproduction method of performing partial response detection of a reproduction signal and reproducing data by using maximum likelihood decoding, comprising the steps of:

providing N×M memory arrays with N memory lines each corresponding to state values $S_k$ (k=0, 1, ..., N-1) in state transition and M memory rows (a, ..., p) storing a maximum likelihood path;

sampling a reproduction signal at a data identification point t so as to detect the reproduction signal level on the basis of a relationship (state transition diagram) between the state values $S_k$ (k=0, 1, ..., N-1) defined from reproduction data candidates and a reproduction signal level at a data identification point at a state transition between the state values, thereby detecting the transition to each of the state values $S_k$ (k=0, 1, ..., N-1) corresponding to a detection value of said reproduction signal level;

storing in each of the memory lines corresponding to each of the state values at a data identification point t, $S_k^t$ (k=0, 1, ..., N-1) detected from detection level values at said data identification point, immediately before they are linked by one branch of maximum likelihood path;

rewriting the state value stored in each of the memory lines into the state value which has been linked by the state values $S_k^t$ (k=0, 1, ..., N-1) detected at the data identification point t and the branch of maximum likelihood path, in order back to each data identification point (t-1, t-2, ..., t-(M-1)); and performing rewriting control of the state value so that the transitions of the state values up to the data identification point t are stored in the sequential memory lines, so as to obtain the reproduced data corresponding to the change of the state values in the M-th row to the state values in the (M-1)-th row.

10. A method according to claim 9, wherein the number of rows, M of said each memory array is at least three times the number of lines, N of said memory arrays.

11. A method according to claim 9, wherein the data is compared with a plurality of threshold values to detect the respective states before shifting.

12. A method according to claim 9, wherein the data is subjected to convolution based on PR(1,2,1).

13. A method according to claim 9, wherein the N state values in said memory row are all coincident, the reproduced data corresponding to said state values is determined.

* * * * *